United States Patent [19]
Tserng et al.

[11] Patent Number: 4,733,195
[45] Date of Patent: Mar. 22, 1988

[54] TRAVELLING-WAVE MICROWAVE DEVICE

[75] Inventors: Hua Q. Tserng, Dallas; Bumman Kim, Richardson, both of Tex.

[73] Assignee: Texas Instruments Incorporated, Dallas, Tex.

[21] Appl. No.: 885,908

[22] Filed: Jul. 15, 1986

[51] Int. Cl.⁴ ............................................... H03F 3/60
[52] U.S. Cl. ...................................... 330/286; 330/54
[58] Field of Search ................... 330/277, 286, 53, 54

[56] References Cited
U.S. PATENT DOCUMENTS
4,543,535  9/1985  Ayasli ................................. 330/286

*Primary Examiner*—Gene Wan
*Attorney, Agent, or Firm*—Carlton H. Hoel; Leo N. Heiting; Melvin Sharp

[57] ABSTRACT

A travelling-wave transistor structure (50) with the input and output transmission lines (54,58) terminated with unmatched impedances (70,72,74;80,82,84) to improve high-frequency response by reflection and phase shift to provide constructive interference is disclosed. Preferred embodiments include a $\pi$-gate (52,56) MESFET structure travelling-wave transistor with many periodically spaced gate feeding fingers (56) connecting gate (52) to gate transmission line (54) which parallels gate (52). This provides a compact structure and has large advantages at millimeter wave frequencies. Source (60) may be grounded by vias (61) or may pass over gate transmission line (54) by air bridges to a ground on the same surface as the MESFET.

13 Claims, 14 Drawing Figures

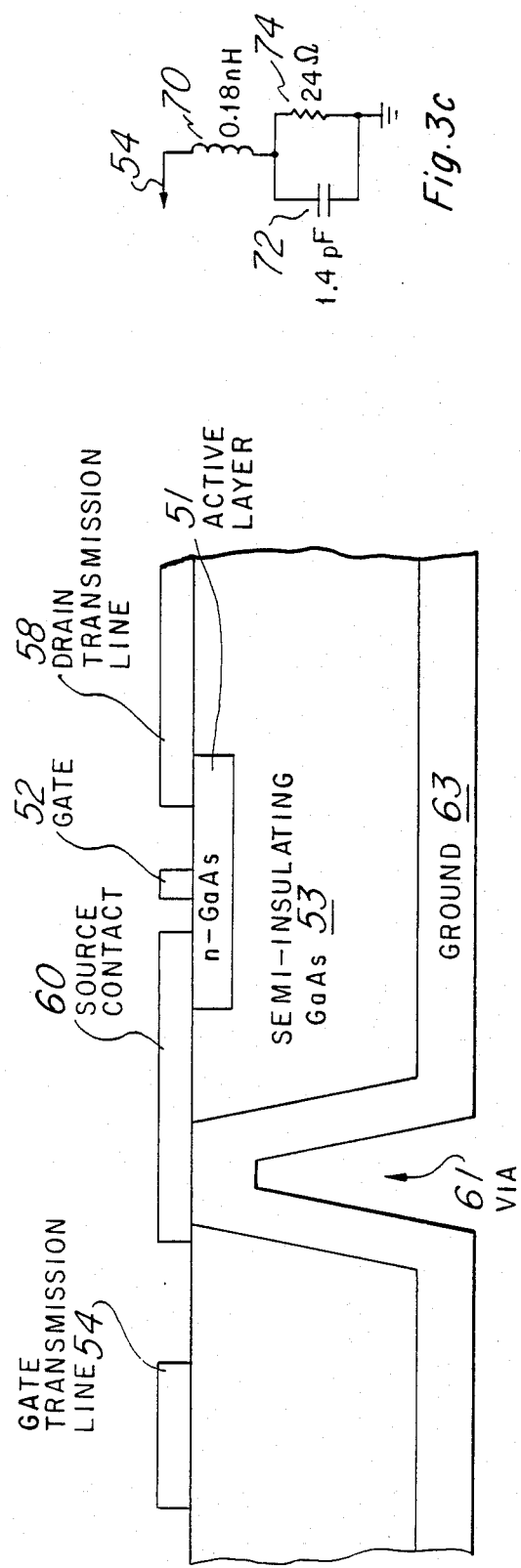

TRAVELLING-WAVE MICROWAVE DEVICE

CROSS-REFERENCE TO RELATED APPLICATIONS

Copending U.S. application Ser. Nos. 717,741, filed Mar. 29, 1985, now U.S. Pat. No. 4,621,239 and 613,678, filed May 24, 1984, disclose related subject matter. All of these cross-referenced applications are assigned to the assignee of this application.

BACKGROUND OF THE INVENTION

1. Field of the Invention

The present invention relates to electronic devices, and, more particularly, to microwave travelling-wave (distributed) devices.

2. Description of the Related Art

The availability of high-gain, high-frequency microwave transistors has revived the old "distributed" or "travelling-wave" approach for broadband microwave amplification but using GaAs FETs; see Y. Ayasli et al, Monolithic GaAs Travelling-Wave Amplifier, 17 Electronics Letters 413 (1981). Such amplifiers are similar to the distributed amplifier using electron tubes, as described in E. L. Ginzton et al. Distributed Amplification, 36 Proc. IRE 956 (1948), in that the intrinsic gate and drain capacitances serve as parts of the shunt elements of two artificial transmission lines: the gate and drain transmission lines. If the line element values (inductances) are chosen properly, wideband amplification can be obtained with more reasonable VSWRs than is possible for an FET having the same total gate width. The Ayasli article reported results of broadband travelling-wave amplification in the 0.5 to 14 GHz band using four discrete 300 μm gate width FETs in a distributed amplifier configuration. See also U.S. Pat. No. 4,486,719 to Ayasli.

McIver, A Traveling-Wave Transistor, 53 Proc. IEEE 1747 (1965), described a travelling-wave transistor structure using distributed active elements (i.e., both the gate and drain were transmission lines with an extended channel region linking the two lines). In the theoretical treatment, the losses associated with the gate and drain resistances were not taken into account, nor was a detailed, practical device realization given either. Several publications have dealt with the distributed effects of the gate transmission line. Due to the use of submicron gate length (for high frequency operation), the gate line has high series as well as shunt resistances, which renders it unusable as an input transmission line of the travelling-wave transistor because the line attenuation is prohibitably high.

Thus it is a problem in the known travelling-wave transistors to obtain broadband high-frequency response.

SUMMARY OF THE INVENTION

The present invention provides a travelling-wave (distributed) device structure with unmatched termination impedances for both the input and output transmission lines; these provide phase-shifted, reflective waves which constructively interfere to extend device bandwidth.

Preferred embodiments include a single $\pi$-gate FET in common source configuration with the gate periodically loading the input transmission line; and both the input and output transmission lines have a termination impedance in the form of a low-pass filter plus a resistance. The low-pass filter portion of the termination provides an unmatched termination and reflection plus phase shift for increased high-frequency response, and the resistance portion of the termination preserves low-frequency response. The periodically loaded $\pi$-gate permits the input transmission line parameters to be set independently of the gate impedance and still have a distributed active device. The layout is extremely compact, which is advantageous for millimeter-wave operation.

This solves the problem of obtaining broadband high-frequency response in the known travelling-wave transistor structures.

BRIEF DESCRIPTION OF THE DRAWINGS

The drawings are schematic for clarity.

FIGS. 3A–C are plan, cross sectional, and detailed termination views of a first preferred embodiment travelling-wave transistor;

DESCRIPTION OF THE PREFERRED EMBODIMENTS

Figure 1:
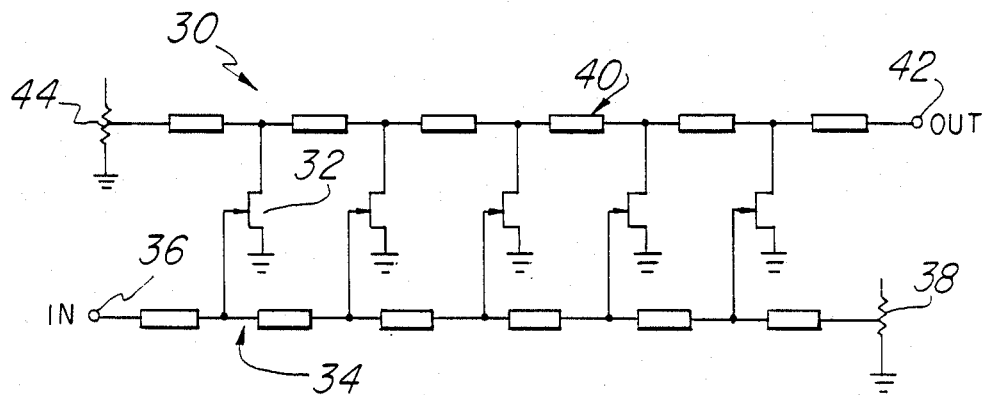
FIG. 1 is a schematic circuit diagram of a travelling-wave transistor.

A travelling-wave transistor, generally denoted 30, is schematically illustrated in FIG. 1 and includes MESFETs 32 (which may be discrete devices or a schematic representation of a single distributed MESFET) in common source connection, gate transmission line 34 which has input terminal 36 at one end and is terminated with matched termination impedance 38 at the other end, and drain transmission line 40 which has output terminal 42 at one end and is terminated with matched termination impedance 44 at the other end. Direct current for bias of FETs 32 is supplied through the termination impedances of the gate and drain transmission lines.

Figure 2:
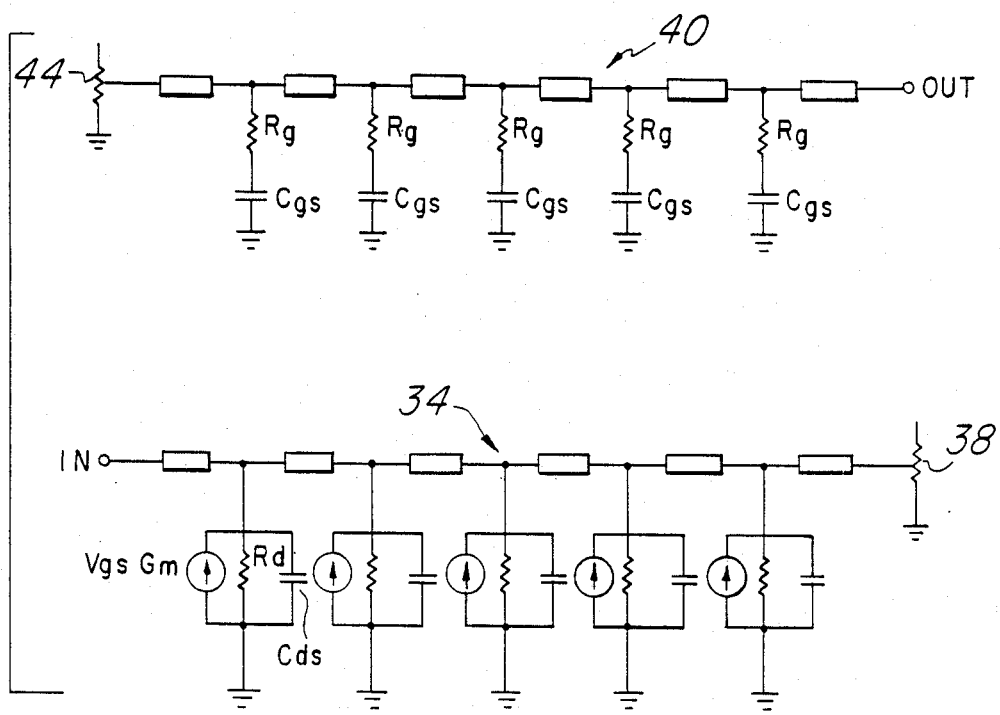
FIG. 2 is an equivalent circuit diagram for the transistor of FIG. 1.

FIG. 2 is a simplified equivalent circuit for transistor 30; gate transmission line 34 and drain transmission line 40 are loaded by FETs 32, but the simplified hybrid $\pi$ model for FETs 32 eliminates the gate-drain coupling capacitance and effectively decouples the two transmission lines except for the transconductance current generator. Conventional travelling-wave amplifier theory requires that terminations 38 and 44 on both the gate and drain transmission lines be matched to the respective transmission line characteristic impedances to avoid reflected waves. This is appropriate for an ideal transistor with no losses. But the dissipative losses ($R_g$ and $R_d$) and possible difference in the two phase velocities of the transmission lines leads to high-frequency gain limitations for travelling-wave transistor 30; and these limitations can be lessened by the use of appropriate unmatched terminations as described in the following.

Figure 3A:
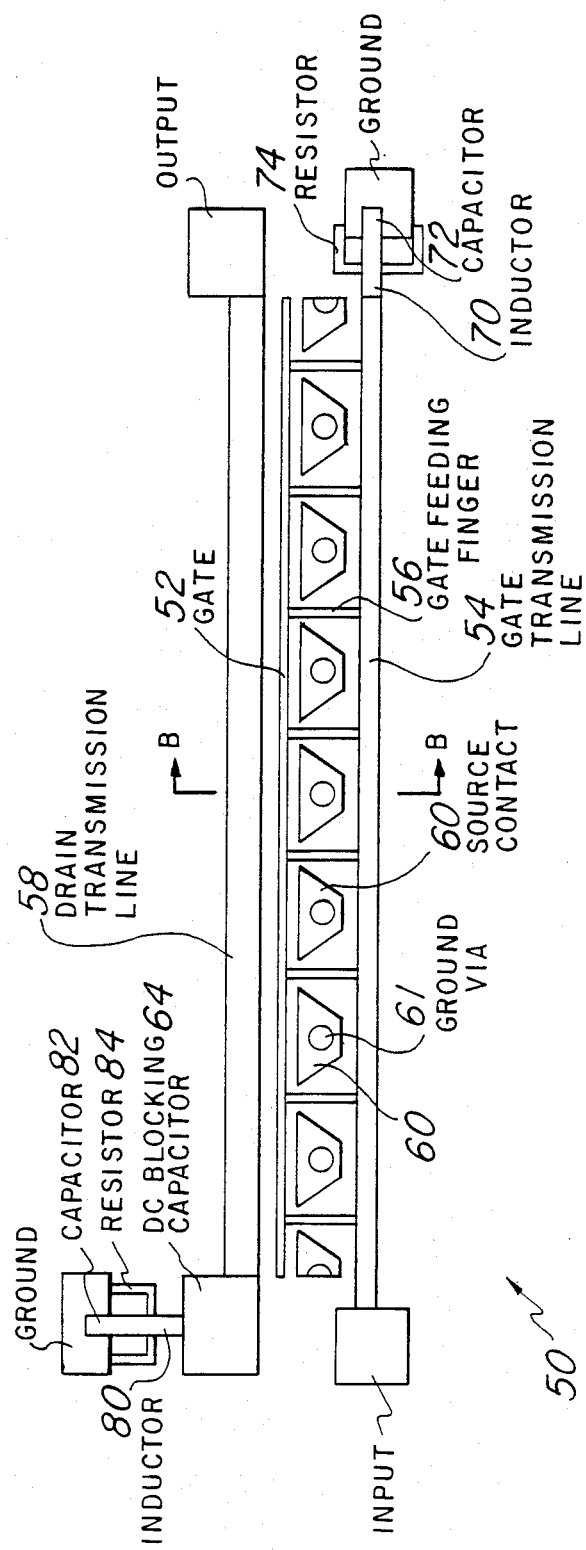

First preferred embodiment travelling-wave transistor is illustrated in schematic plan view and cross sectional elevation view in FIGS. 3A-B, respectively, and is generally denoted 50. Transistor 50 is in the form of a single distributed active MESFET device monolithically fabricated in active layer 51 in semi-insulating GaAs substrate 53. In particular, transistor 50 includes gate 52 which is 1200 μm wide (horizontal in FIG. 3A) and 0.5 μm long, gate transmission line 54 paralleling gate 52, eight gate feeding fingers 56 periodically connecting gate 52 to gate transmission line 54, drain transmission line 58 which is also the drain contact (see FIG. 3B which is a cross sectional elevation view along line B—B of FIG. 3A and illustrates the microstrip transmission line structure of gate transmission line 54 and drain transmission line 58), source contact 60 which is grounded through vias 61 to backside plated ground 63, drain transmission line termination consisting of dc blocking capacitor 64 and inductor 80, capacitor 82, plus resistor 84, and gate transmission line termination consisting of inductor 70, capacitor 72, plus resistor 74. The separation between gate 52 and source contact 60 is about 1.0 μm and the separation between gate 52 and drain contact 58 is also about 1.0 μm. Source contact 60 is grounded through vias 61 as shown in FIG. 3A; alternatively, source contacts 60 could be connected by air bridges over gate transmission line 54 to a ground on the surface of GaAs substrate 53. The structure of transistor 50 is very compact and this is especially advantageous at millimeter wave frequencies.

FIG. 3C is a schematic circuit diagram for the gate transmission line termination showing the connections of inductor 70, capacitor 72, and resistor 74 to gate transmission line 54. The drain transmission line termination is similar. A dc power supply is connected through rf chokes to drain transmission line 58 to bias the FET; this dc bias supply is not shown in FIG. 3A for clarity, but could be attached at dc blocking capacitor 64. Gate transmission line 54 and gate 52 are dc biased at zero volts relative to ground, although this could be changed by adding a dc bias supply plus blocking capacitor. Typically the drain dc voltage is 5 V and the drain current about 350 mA.

Gate transmission line 54 is periodically loaded by gate 52 of the FET through gate feeding fingers 56; this eliminates the limitation on the gate transmission line impedance level of distributed transistors by using a separate gate transmission line formed on the semi-insulating substrate. The periodicity of the FET loading is determined by the bandwidth and gain requirements. The following simple approximation analysis will help explain the design choices and effect of the gate transmission line termination.

Figure 4:
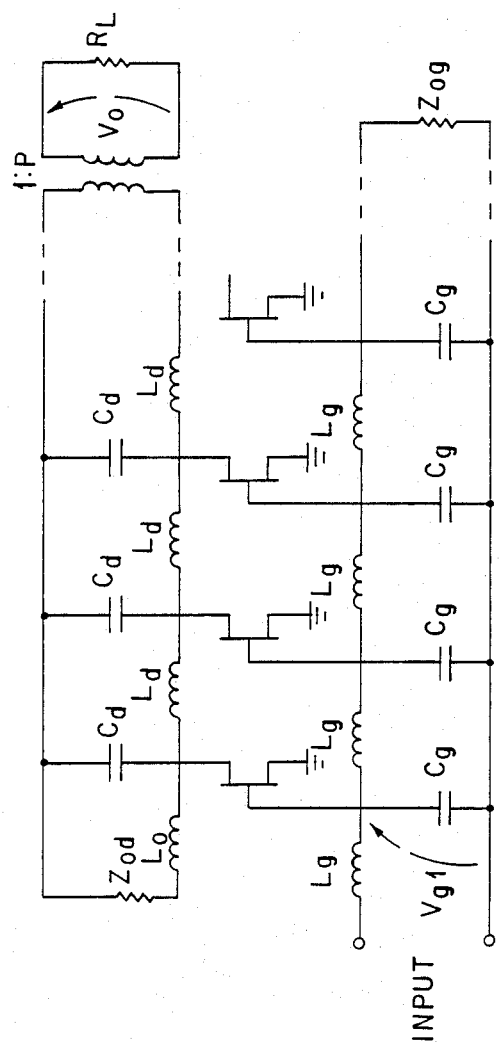
FIGS. 4–5 illustrate ideal and lossy travelling-wave transistors used in explanatory analysis.

First consider an ideal lossless travelling-wave transistor made of N common source connected FETs with the gate and drain capacitances absorbed into the gate and drain transmission lines, respectively, to yield lumped $L_g$ and $C_g$ for the gate transmission line and $L_d$ and $C_d$ for the drain transmission line; see FIG. 4. The transmission lines are terminated with their characteristic impedances, $Z_{0g}$ and $Z_{0d}$. The transistor input and output impedances are thus equal to $Z_{0g}$ and $Z_{0d}$ up to about the cutoff frequencies $$f_c = \frac{1}{\pi\sqrt{L_g C_g}}, \frac{1}{\pi\sqrt{L_d C_d}}.$$

The voltage gain of the travelling-wave transistor is $$A = \frac{N g_m}{2} \sqrt{Z_{0g} Z_{0d}}$$

where $g_m$ is the transconductance of a single FET. For broadband amplification the phase velocity of the gate transmission line must equal the phase velocity of the drain transmission line to have the input and output travelling waves synchronized; this can be seen from the following coupled mode analysis.

The coupled mode equations with normalized mode amplitudes and z the variable along the transmission lines are for the forward waves:

$$\frac{dv_{g+}}{dz} = -j\omega\sqrt{L_g C_g}\, v_{g+}$$

$$\frac{di_{d+}}{dz} = -g_m v_{g+} - j\omega\sqrt{L_d C_d}\, i_{d+}$$

and for the backward waves:

$$\frac{dv_{g-}}{dz} = j\omega\sqrt{L_g C_g}\, v_{g-}$$

$$\frac{di_{d-}}{dz} = -g_m v_{g-} + j\omega\sqrt{L_d C_d}\, i_{d-}$$

The boundary values are: $v_{g+}(0)$ is the input signal; $v_{g-}(N)$ vanishes because the gate transmission line has a matched termination and no reflection; and $i_{d+}(0)$ and $i_{d-}(N)$ also vanish due to the matched terminations on the drain transmission lines preventing reflections. For notational simplicity set $$\beta_g = \omega\sqrt{L_g C_g} \text{ and } \beta_d = \omega\sqrt{L_d C_d};$$

this yields to the following solutions:

$$v_{g+}(z) = e^{-j\beta_g z} v_{g+}(0)$$

$$i_{d+}(z) = -g_m v_{g+}(0) \frac{\sin\left(z\left(\frac{\beta_d - \beta_g}{2}\right)\right)}{\frac{\beta_d - \beta_g}{2}} e^{-jz\left(\frac{\beta_d + \beta_g}{2}\right)}$$

and $v_{g-}(z) = i_{d-}(z) = 0$. Thus the power gain includes the square of $$\frac{\sin\left(N\left(\frac{\beta_d - \beta_g}{2}\right)\right)}{\left(N\left(\frac{\beta_d - \beta_g}{2}\right)\right)}$$

which is a maximum at $\beta_d = \beta_g$, in other words, with equal phase velocities in the gate and drain transmission lines. Thus the phase velocities are designed to be equal.

Further, the phase shift from the gate transmission line voltage input to the drain transmission line current output is seen from the solution to be $$N\left(\frac{\beta_d + \beta_g}{2}\right)$$

plus any phase shift $\phi$ from the FETs. Because the phase velocities are designed to be equal for maximum power, $\beta_d = \beta_g$, and with this common value simply denoted $\beta$, the phase shift is $N\beta$ plus phase shift $\phi$ from the FETs. Of course, $N\beta$ is then also equal to the phase shift along the gate line and the phase shift along the drain transmission line.

Figure 5:
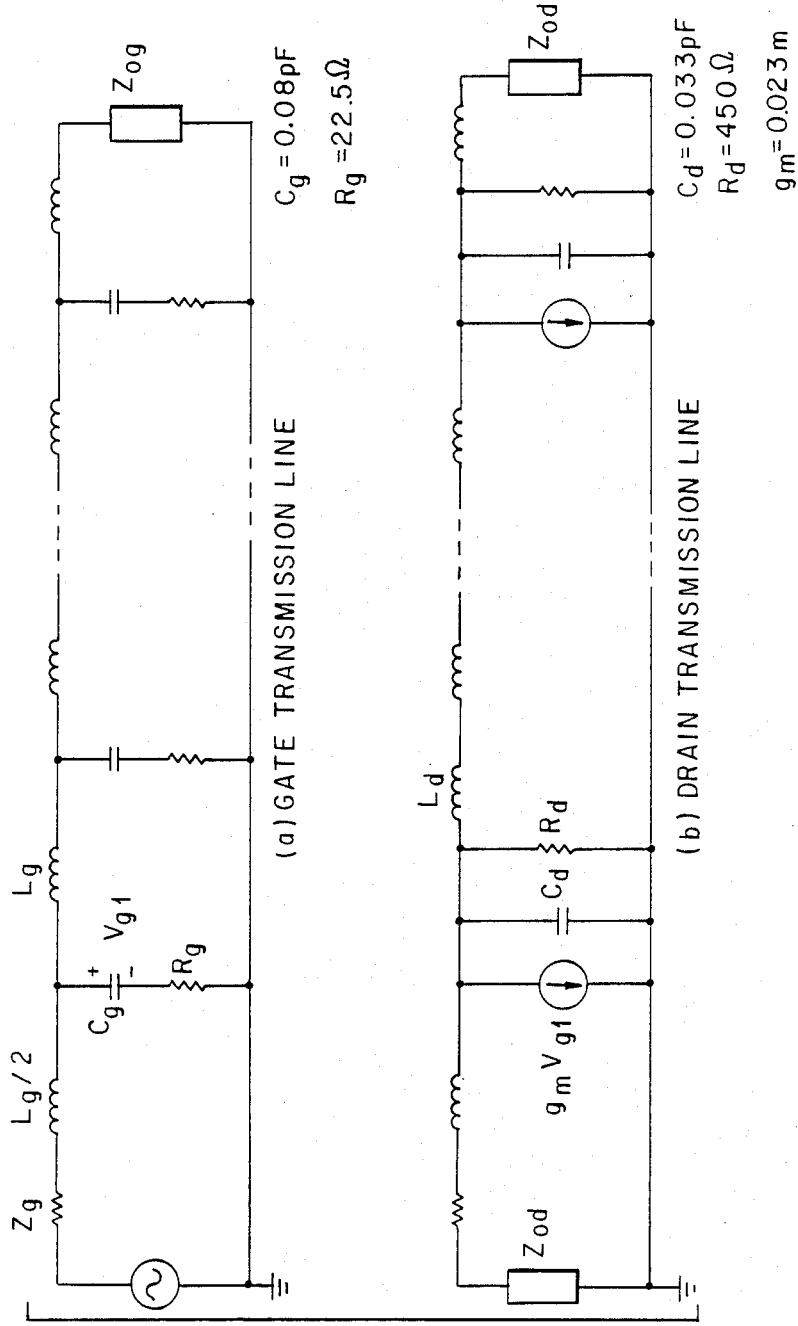

Next consider the nonideal travelling-wave transistor which has the same structure as the ideal transistor just considered but with the FET equivalent circuit input and output resistances comparable to the capacitances and included in the circuit as simplified and shown in FIG. 5. The resistances imply attenuation and phase shift of the input and output travelling waves. For frequencies below the cutoff, the image attenuation coefficients per device may be approximated as:

$$\alpha_g = \frac{\omega^2 C_g^2 R_g Z_{0g}}{2}$$

$$\alpha_d = \frac{Z_{0d}}{2R_d}$$

where $Z_{0g}$ and $Z_{0d}$ are the characteristic impedances of the gate and drain transmission lines at low frequencies (below cutoff). The voltage gain for the nonideal travelling-wave transistor incorporates the effect of the losses into the ideal case and is approximated as follows:

$$A = \sum_{k=1}^{N} \frac{g_m}{2} \sqrt{Z_{0g} Z_{0d}} \, e^{-k\alpha_g} e^{-(N+1-k)\alpha_d} \frac{1}{\sqrt{1 + \omega^2 C_g^2 R_g^2}}$$

Thus the bandwidth is determined by the three factors of the voltage gain expression: the (frequency-dependent) characteristic impedances $Z_{0g}$, $Z_{0d}$, the losses (attenuations), and the frequency-dependent voltage divider effects in the input of each FET (the last square root factor). The characteristic impedances depend on the frequency simply by $$Z_0 = \sqrt{\frac{L}{C}} \sqrt{1 - \left(\frac{f}{f_c}\right)^2}$$

with $f_c$ the cutoff frequency defined above. The most important bandwidth reduction factors are those that increase with frequency, and the above approximate analysis indicates that losses in the gate line are the most significant. This suggests modifications in the gate line in order to extend the bandwidth.

If the gate and drain transmission line terminations are not matched, then an input forward wave in the gate transmission line would give rise to a secondary forward wave in the drain transmission line in addition to the forward wave resulting from direct amplification of the forward gate transmission line wave. This secondary wave arises as follows: the unmatched gate transmission line termination generates a backward wave in the gate transmission line by reflection of the input forward wave, and this backward wave is amplified to yield a backward wave in the drain transmission line which, in turn, is reflected from the unmatched drain transmission line termination to yield a forward wave which interferes with the forward wave generated by direct amplification of the forward wave in the gate transmission line. And if this interference were constructive for frequencies about the upper limit of the frequency band of the travelling-wave transistor with matched terminations, then the bandwidth would be extended.

In particular, the previously analyzed coupled mode equations can be solved for the backward wave with a nonzero $v_{g-}(N)$. The backward equations are the same as the forward equations with z replaced by $N-z$ and $g_m$ replaced by $-g_m$; thus the solutions have the same form. In particular, the phase shift from the gate termination $(v_{g-}(N))$ to drain termination $(i_{d-}(0))$ is also $N\beta + \phi$. If the gate transmission line termination together with the drain transmission line termination provide a total phase shift of $-2N\beta$, then this secondary forward wave in the drain transmission line has a phase shift of zero relative to the forward directly amplified wave (total phase shift from input to output equals $N\beta + \phi$ for the directly amplified wave and $3N\beta + \phi - 2N\beta$ for the secondary wave because the secondary wave travels three lengths of the transmission lines and has a total reflection phase shift of $-2N\beta$). Thus, constructive interference is obtained with proper total phase shift by the terminations.

The gate line termination illustrated in FIG. 3C connected to a transmission line of characteristic impedance equal to the resistance has a reflection coefficient of:

$$\Gamma = \frac{s^2 LCR + s(L - R^2 C)}{s^2 LCR + s(L + R^2 C) + 2R}$$

which, at the resonant frequency with the element values shown (about 10 GHz), is real and approximately equal to $-0.8$. Thus this provides a large magnitude reflected wave $(v_{g-}(N))$ with a phase shift of $\pi$. Thus $N\beta$ is to be $$\frac{\pi}{2} + \eta\pi.$$

Now $\beta$ is set by design of the gate and drain transmission lines ($L_g$ and $L_d$ are directly determined) and is constrained to yield the desired transmission line characteristic impedance and maximize cutoff frequency, and so N is determined by the reflected wave phase shift requirement.

Generally, the gate and drain transmission line terminations are designed to provide a large magnitude reflected wave plus desired phase shift at the frequency corresponding to the upper limits of the frequency band of the travelling-wave transistor with matched gate and drain transmission line terminations; this extends the bandwidth of the travelling-wave transistor.

The unmatched gate transmission line termination provides flexibility for design of the desired characteristic impedance for a specific gain-bandwidth product. For example, loaded gate transmission line 54 has a characteristic impedance of about 50 Ω and drain transmission line 58 has a characteristic impedance of 70 Ω.

Further characteristics of transistor 50 are best described in connection with a method of fabrication as follows:

Start with a semi-insulating GaAs substrate of convenient thickness, and form an active layer of n type ($3 \times 10^{17}$ carriers per cm$^3$) GaAs about 1 μm thick on the substrate by ion implantation, vapor phase epitaxy, or molecular beam epitaxy. Next form isolation patterns by mesa etching or boron isolation implantation, and deposit by liftoff and alloying ohmic contacts of Au:-Ge/Ni/Au for source contact 60 and drain transmission line 58. Gate 52, gate feeding fingers 56, and gate transmission line 54 are defined by either optical or electron beam lithography; the gate metals are either Al or Ti/Pt/Au. This completes the FET portion, and fabrication of resistors, capacitors, inductors, air-bridge interconnects, and via holes follows. First a Ti/Au layer is evaporated on the pads of the FET, the capacitor bottom plates, and the inductors. In the next step the capacitors are formed with silicon nitride the primary dielectric. Then the Ti/Au capacitor top plates are defined; all metal layers so far have been defined by evaporation and liftoff. Next gold plating forms the air bridges, and at the same time the inductors and pads are also plated to reduce their resistances. The plated thicknesses should be at least several skin depths at the operating frequency. Lastly, the backside process is performed: the substrate is lapped to the required thickness, about 100 μm, and grounding vias are etched through the substrate by wet chemical or reactive ion etching. Reactive ion etching provides better control of the via size and aspect ratio. Then the backside is completely gold plated, including vias, to serve as a grounding plane and also as a plated heat sink. The substrate is then sawed into separate devices.

Figure 6:
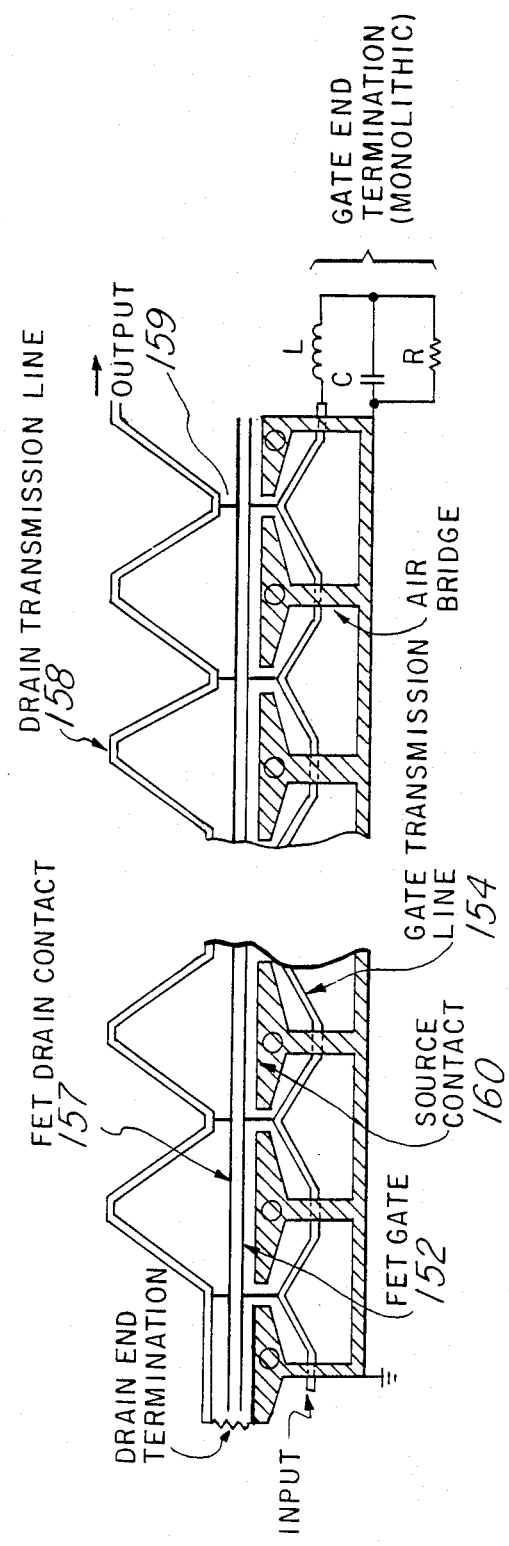
FIG. 6 is a schematic plan view of a second preferred embodiment travelling-wave transistor.

Second preferred embodiment travelling-wave transistor 150 is similar to transistor 50 and shown in plan view in FIG. 6. A separate drain transmission line 158 is used and connected to drain contact 157 by periodic feeding fingers 159, and source contact 160 could be grounded by vias rather than the air bridges shown. Gate 152 has 2500 μm gate width. Gate transmission line 154 has a gate termination similar to that of transistor 50. With a pure reactive termination (primarily inductive), transistor 150 can be operated as a bandpass amplifier with the low-frequency cut-off adjusted by the magnitude of the terminating inductances.

Figure 7:
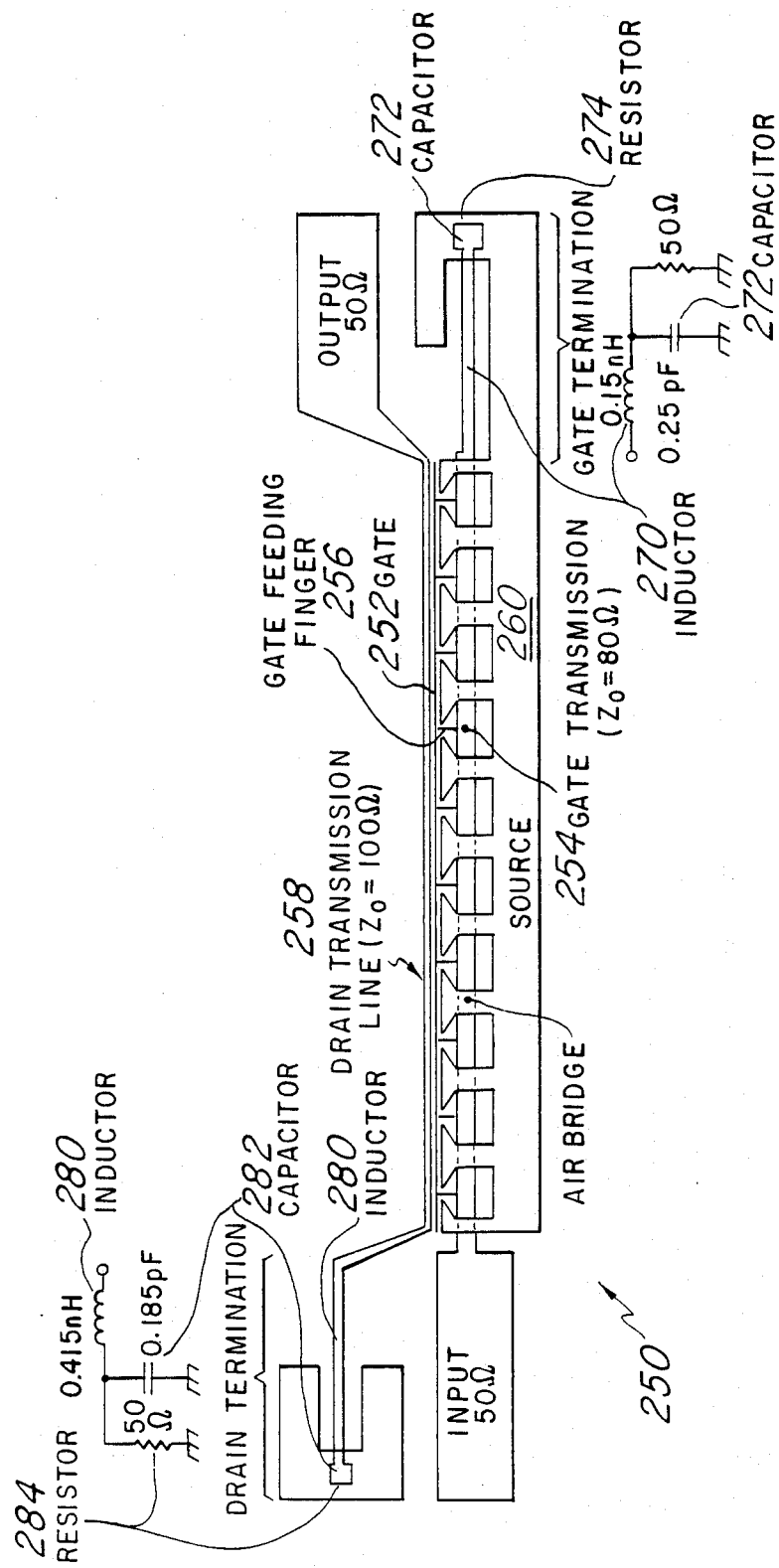
FIGS. 7–8 are schematic plan and equivalent circuit views of a third preferred embodiment travelling-wave transistor.
Figure 8:
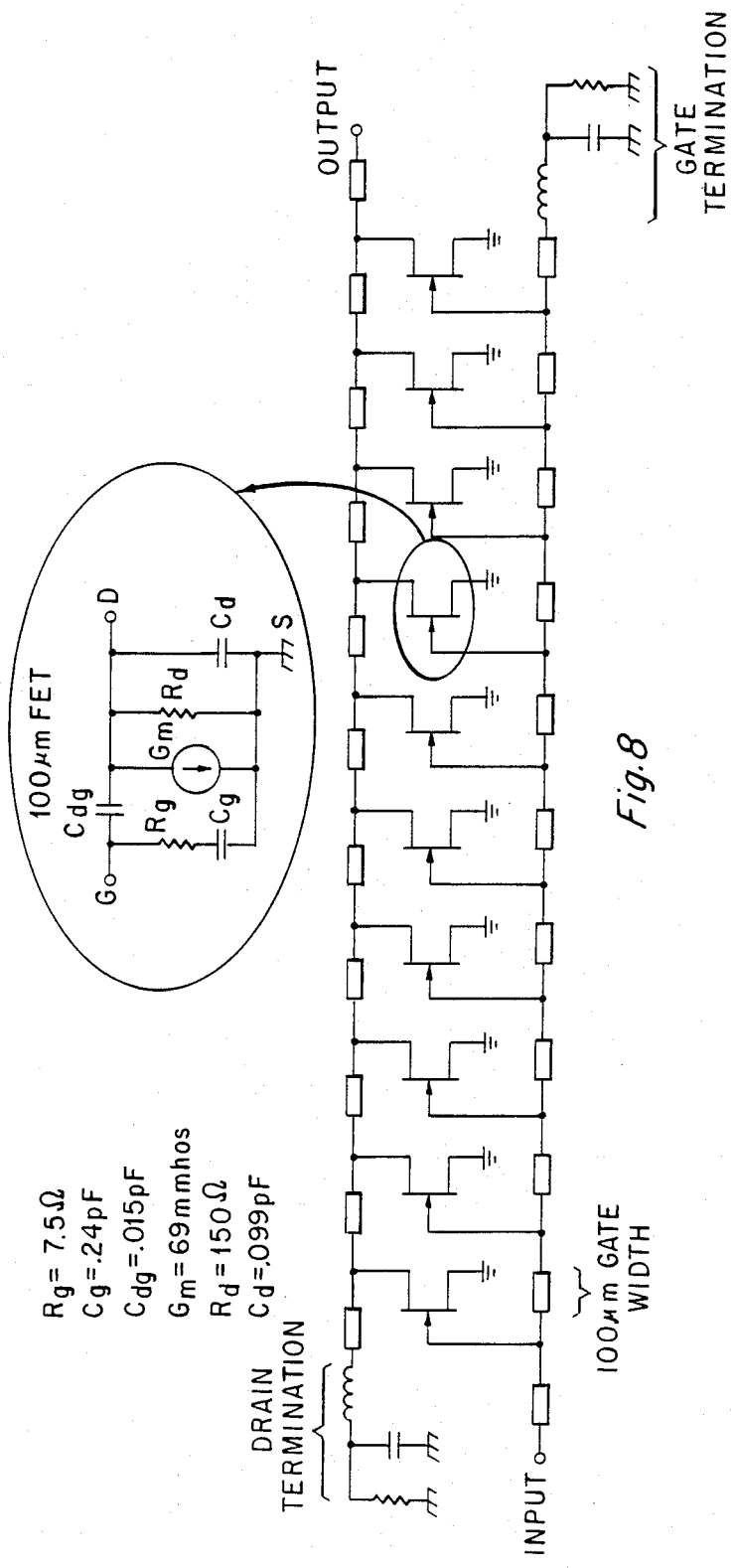
Figure 9:
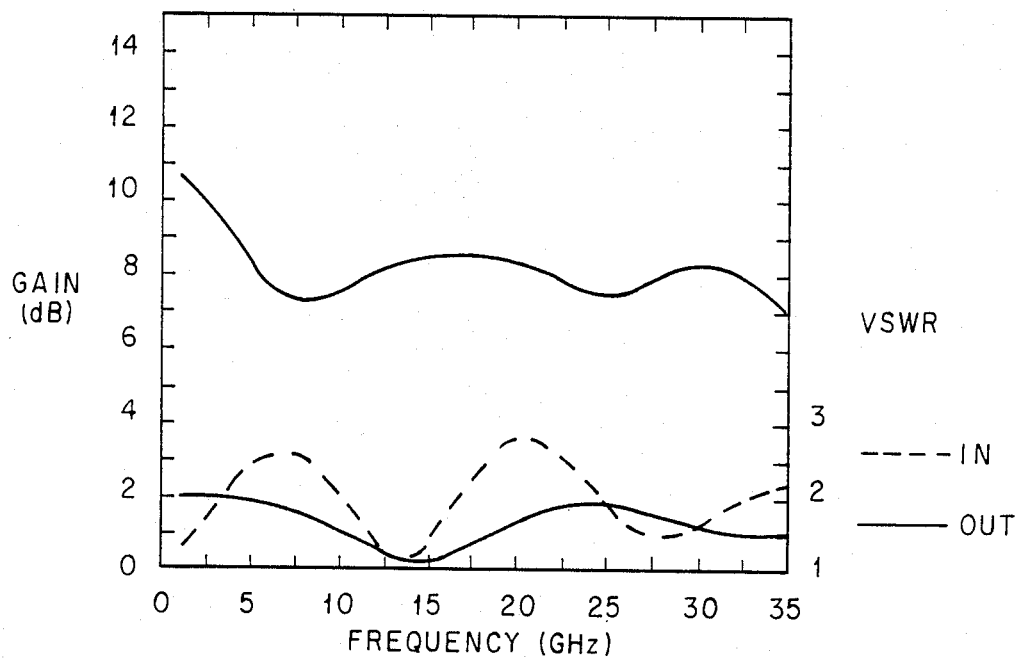
FIGS. 9–11 illustrates the characteristics of the third preferred embodiment.
Figure 10:
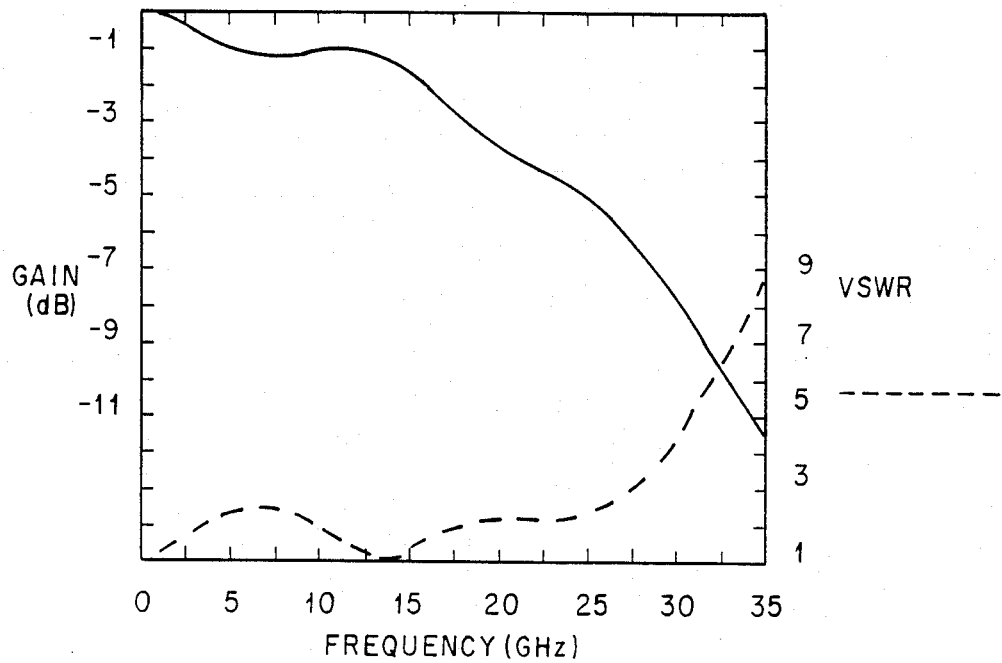

Third preferred embodiment travelling-wave transistor 250 is shown in plan view in FIG. 7 and is similar to transistor 50 but with ten stages of 100 μm gate width instead of eight stages of 150 μm gate width and with low pass filter terminations on both the gate and drain transmission lines. The elements of transistor 250 have reference numerals corresponding to the related elements of transistor 50. The drain bias supply through an rf choke is not shown for clarity. With the gate and drain transmission line lengths both fixed at 100 μm per stage, with the FET parameters and modelling as in FIG. 8 and with 50 Ω input and output characteristic impedances, optimization to maximize the gain-bandwidth product yields the values of the elements of transistor 250 as shown in FIG. 7. Note that the gate termination has a resonance frequency of about 26 GHz, whereas the drain termination resonance is about 18 GHz; thus the optional terminations are not necessarily the same in the gate and drain transmission lines. The gain and input and output VSWRs are shown as a function of frequency in FIG. 9. As expected, the smaller drain capacitance in the FET model requires a higher characteristic impedance in the drain transmission line than in the gate transmission line for optimization. With a 150 μm thick substrate, the gate and drain transmission lines as microstrip lines will have 25 μm and 12.5 μm linewidths, respectively. The gate transmission line loss and the VSWR at the gate transmission line termination are shown in FIG. 10; the loss is roughly as predicated by the simplified analysis above (quadratic in frequency) and the VSWR shows the large reflection at the gate termination for higher frequencies and extension of bandwidth. This indicates the goal of termination design to extend bandwidth: at frequencies about the upper end of the band without reflective terminations, the gate and drain terminations should provide large reflection and the appropriate phase shift for large constructive interference; whereas at other frequencies the reflection should be minimized.

Figure 11:
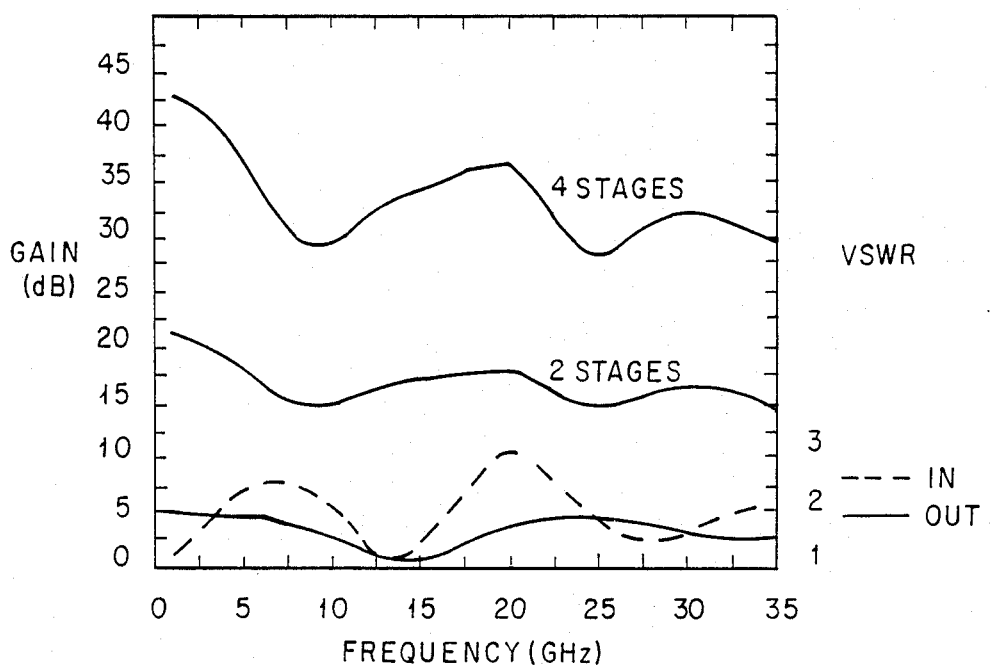

To achieve higher gain, several devices can be cascaded. FIG. 11 shows the gain-frequency response for two and four cascaded travelling-wave transistors, each similar to transitor 250; note that the input and output VSWRs are practically independent of the numbers of transistors cascaded. The gain ripple of the cascaded transistors may be reduced by designing a staggering of the ripples of the individual travelling-wave transistors.

To obtain maximum power per unit gate width from an FET, the device must be driven with the optimum voltage swing at both input and output, and it must be loaded with the optimum impedance. In a simple travelling-wave transistor with constant impedance lines these conditions cannot be satisfied; the output signal builds up as it travels down the line, and this leads to a change in the apparent load impedance (from the point of view of the FET). And on the input side, the signal is attenuated as it propagates down the transmission line, and therefore drives the more distant elements at a reduced level.

Figure 12:
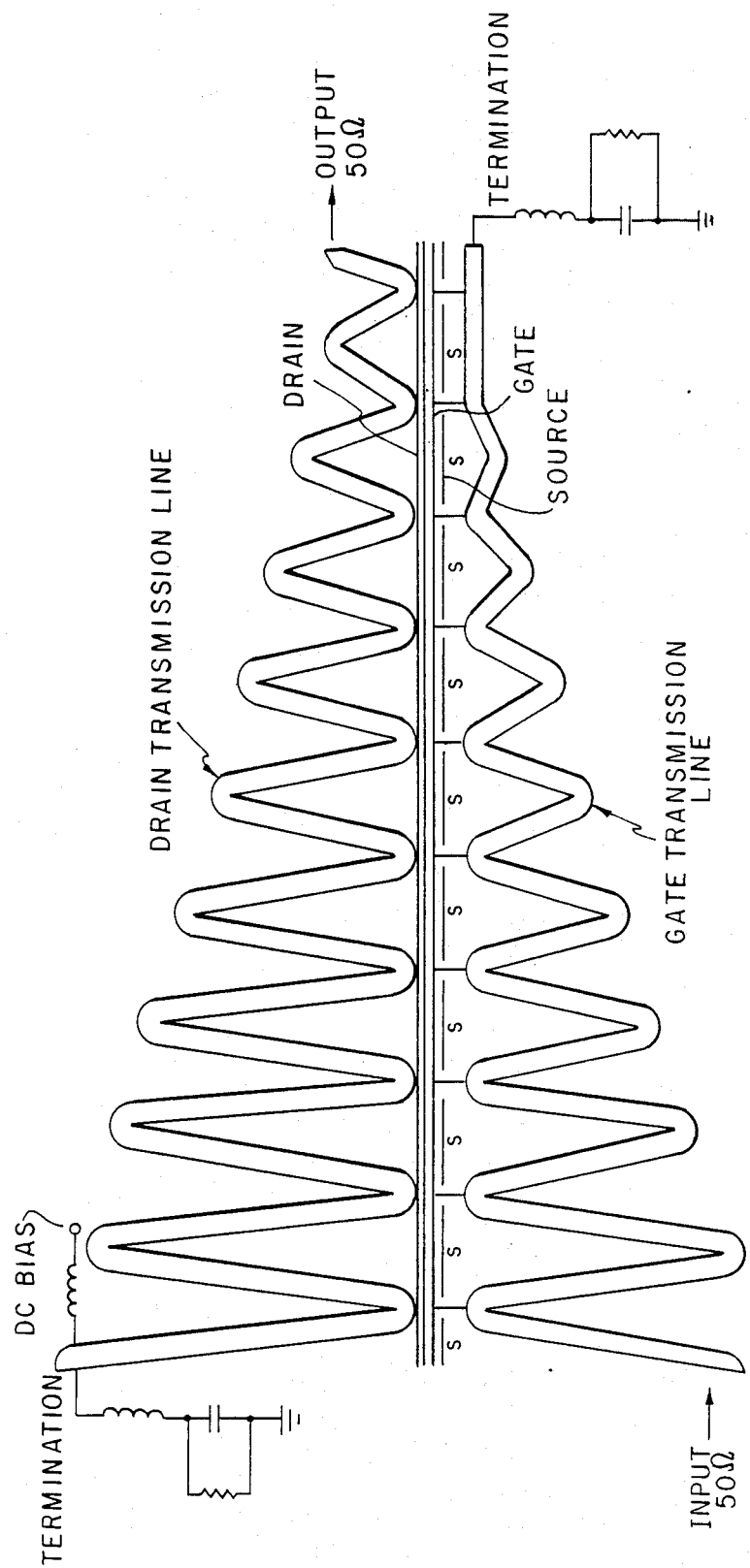
FIG. 12 is a schematic plan view of a fourth preferred embodiment travelling-wave transistor.

The solution to these problems is to taper the impedance levels of both the input and output lines within the travelling-wave structure. This tapering is done in such a way that the voltage amplitude of each signal is maintained at a constant level, in spite of the fact that power is being extracted from the input line and added to the output line. FIG. 12 is a schematic plan view of a fourth preferred embodiment travelling-wave transistor with such tapered impedance gate and drain transmission lines. The source contacts are grounded through vias not illustrated.

MODIFICATIONS AND ADVANTAGES

Various modifications of the preferred embodiment devices and methods may be made while retaining the feature of an unmatched termination on the input transmission line which generates phase shifted, reflected waves for constructive interference. For example, terminations other than a simple low pass filter can be used; periodically arranged discrete devices such as vacuum tubes or bipolar transistors can be connected to the transmission lines; and common gate and common drain connected FETs and dual gate FETs can be used (with the dual gated FET, one of the gates can be a control and connected to a fixed potential). And the dimensions, shapes, materials, and types of the devices could be varied together with the power levels, operation temperature, and so forth.

Applications of the unmatched terminated travelling-wave transistor include connections as (1) an oscillator, (2) a millimeter wave amplifier or oscillator (the higher impedance levels of the travelling-wave transistor make it easier to match the impedance in a large gate width device), (3) a phase shifter by using a varactor in the gate termination, and (4) a high-frequency power amplifier by the extension of the complex gate termination concept, two RF signals can be applied simultaneously to the sending and receiving ends of the gate transmission line and the output power combined at the two drain terminals. External power dividers/combiners can be used. In this way, a FET with large gate width can be matched without involving low impedance levels as in the case of conventional matching approach.

The advantages of the travelling-wave transistor with a single extended gate connected by feeding fingers to a separate gate transmission line and with reflective gate and drain transmission line terminations also include large bandwidth and compact layout.

What is claimed is:

1. A travelling-wave device, comprising:
   (a) an input transmission line;
   (b) an output transmission line;
   (c) at least one active device distributed between said two transmission lines;
   (d) a first termination for said input transmission line, said first termination providing substantial reflection and phase shift at a first frequency, wherein said first frequency is about the upper end of the frequency band of said travelling-wave device; and
   (e) a second termination for said output transmission line, said second termination providing substantial reflection and phase shift as said first frequency, wherein the sum of the phase shifts of said first and second terminations approximates the sum of the phase shifts along the lengths of said input and output transmission lines.

2. The device of claim 1, wherein:
   (a) said at least one active device is a single FET with a plurality of gate feeding fingers connecting the gate of said FET to said input transmission line;
   (b) the drain contact of said FET is connected to said output transmission line; and
   (c) the source contact of said FET is connected to a reference terminal.

3. The device of claim 2, further comprising:
   (a) a plurality of source contacts for said FET with each of said source contacts located between a pair of said gate feeding fingers;
   (b) said input transmission line is parallel to said gate; and
   (c) said output transmission line is integral with the drain contact of said FET.

4. The device of claim 3, wherein:
   (a) said FET is formed at a first surface of a semiconductor substrate;
   (b) said transmission lines are microstrip lines on said first surface with a ground plane on a second surface of said substrate;
   (c) each of said plurality of source contacts is connected through a via to said ground plane; and
   (d) said gate feeding fingers are formed on said first surface.

5. The device of claim 3, wherein:
   (a) said FET is formed at a first surface of a semiconductor substrate;
   (b) said transmission lines are microstrip lines on said first surface with a ground plane on a second surface of said substrate;
   (c) each of said plurality of source contacts is connected by an air bridge over said input transmission line to a reference line on said first surface; and
   (d) said gate feeding fingers are formed on said first surface.

6. The device of claim 1, wherein:
   (a) said at least one active device is a single FET with a plurality of gate feeding fingers connecting the gate of said FET to a reference terminal;
   (b) the drain contact of said FET is connected to said output transmission line; and
   (c) the source of said FET is connected to said input transmission line.

7. The device of claim 1, wherein:
   (a) said at least one active device is a single dual-gate FET with a plurality of gate feeding fingers connecting the first gate of said FET to said input transmission line;
   (b) the second gate is connected to a reference potential;
   (c) the drain contact of said FET is connected to said output transmission line; and
   (d) the source contact of said FET is connected to a reference terminal.

8. A monolithic semiconductor travelling-wave device, comprising:
   (a) a semiconductor substrate with substantially planar upper and lower surfaces, said lower surface containing a conductive region;
   (b) an input conductive line on said upper surface, said input conductive line over said conductive region and forming an input transmission line therewith;
   (c) an output conductive line on said upper surface, said output conductive line over said conductive region and forming an output transmission line therewith;
   (d) an active area in said substrate at said upper surface;
   (e) a gate on said upper surface and over said active area;
   (f) a source contact on said upper surface and over said active area;
   (g) a drain contact on said upper surface and over said active area, said active area, sourcce contact, gate, and drain contact forming a field effect transistor;
   (h) a plurality of gate feeding fingers connecting said gate to said input conductive line;
   (i) a connection between said drain contact and said output conductive line;
   (j) a reference terminal connected to said source contact;
   (k) a first termination for said input transmission line; and
   (l) a second termination for said output transmission line, said first and second terminations providing substantial reflection and phase shift about the upper end of the frequency band of said travelling-wave device.

9. The device of claim 8, wherein:
   (a) said substrate is semi-insulating gallium arsenide;
   (b) said active area is a doped region in said substrate;
   (c) said gate forms a Schottky barrier with said active area;
   (d) said drain contact forms an ohmic contact with said active area;

(e) said source contact is a plurality of ohmic contacts with said active area, each of said plurality located between two of said gate feeding fingers;

(f) said input and output conductive lines are made of metal on said upper surface; and (g) said conductive region is made of metal on said substrate lower surface.

10. The device of claim 9, wherein:

(a) said drain contact is integral with said output conductive line; and (b) said each of said plurality of ohmic contacts is connected through a via in said substrate to said conductive region;

11. The device of claim 9, wherein:

(a) said drain contact is connected to said output conductive line by a plurality of drain feeding fingers;

(b) said reference terminal is on said upper surface; and (c) said each of said plurality of ohmic contacts is connected to said reference terminal by an air bridge over said input conductive line.

12. A monolithic amplifier, comprising:

(a) a semiconductor substrate having an upper surface and a conductive lower surface;

(b) an integrated amplifier circuit disposed along said upper surface, said circuit including i. an input means for receiving a signal to be amplified from a signal source at one end, ii. a plurality of successive amplifying stages including input and output elements for amplifying a signal received, and iii. an output means for providing the amplified signal to a load;

iv. each of said amplifying stages including a field effect transistor having a respective source contact, drain contact, and gate on said surface, and an underlying source, drain, and channel below said respective source contact, drain contact, and gate, said gate controlling the conductivity of the respective channel between said source and said drain, said gate being the input element for the stage and connected to said input means, and said drain being the output element for the stage and connected to said output means, said input and output means each including a conductive strip on said upper surface providing input and output transmission lines having connections to said gate and drain of each stage;

(c) an input termination impedance between the end of said input transmission line opposite said signal source and said conductive lower surface;

(d) an output termination impedance between the end of said output transmission line opposite said load and said conductive bottom surface, said input and output termination impedances providing substantial reflection plus total phase shift approximating the sum of the phase shifts along said input and output transmission lines for waves of frequencies about the upper end of the amplifier's frequency band.

13. The amplifier of claim 12, wherein:

(a) said gates of said stages are formed as a single gate;

(b) said drain contacts of said stages are formed as a single drain contact which is integral with said output conductive strip; and (c) each of said source contacts is connected through a via in said substrate to said conductive lower surface.

* * * * *